United States Patent
Yu et al.

(10) Patent No.: US 11,606,867 B2
(45) Date of Patent: Mar. 14, 2023

(54) FOLDABLE DISPLAYS AND METHODS

(71) Applicant: The Hong Kong University of Science and Technology, Kowloon (HK)

(72) Inventors: Hongyu Yu, Kowloon (HK); Siqi Yu, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 358 days.

(21) Appl. No.: 16/794,989

(22) Filed: Feb. 19, 2020

(65) Prior Publication Data
US 2020/0275564 A1 Aug. 27, 2020

Related U.S. Application Data

(60) Provisional application No. 62/918,935, filed on Feb. 21, 2019.

(51) Int. Cl.
*H01L 25/18* (2006.01)
*H05K 5/00* (2006.01)
*H01L 25/16* (2023.01)

(52) U.S. Cl.
CPC ......... *H05K 5/0017* (2013.01); *H01L 25/167* (2013.01); *H01L 25/18* (2013.01); *H05K 5/0021* (2013.01)

(58) Field of Classification Search
CPC .. H05K 5/0017; H05K 5/0021; H01L 25/167; H01L 25/18; G09F 9/301; G09F 9/33; G09F 9/35
See application file for complete search history.

(56) References Cited

U.S. PATENT DOCUMENTS

| | | | |
|---|---|---|---|
| 10,067,369 B2 | 9/2018 | Liu et al. | |
| 10,074,701 B2 | 9/2018 | Jeong et al. | |
| 10,152,914 B2 | 12/2018 | Meersman et al. | |
| 2005/0078104 A1 | 4/2005 | Matthies et al. | |
| 2015/0207102 A1 | 7/2015 | Jeong et al. | |

(Continued)

FOREIGN PATENT DOCUMENTS

WO 2018/037311 A1 3/2018

OTHER PUBLICATIONS

Park et al.,"World's first large size 77-inch transparent flexible OLED display", DOI # 10.1002/jsid.663, 2018, pp. 287-295.

(Continued)

*Primary Examiner* — Elias Ullah
(74) *Attorney, Agent, or Firm* — Amin, Turocy & Watson, LLP

(57) ABSTRACT

Various foldable, or flexible, displays and associated methods are enabled. For instance, a screen comprises a first rigid display at a first end of a surface of a flexible substrate. A second rigid display is at a second end of the surface of the flexible substrate. A flexible display is on the surface of the flexible substrate, between the first rigid display and the second rigid display, wherein a first section of the flexible substrate underneath the flexible display is thicker than a second section of the flexible substrate underneath the first rigid display or the second rigid display, and the first rigid display and second rigid display, and flexible display are covered with a protective foldable layer.

20 Claims, 13 Drawing Sheets

(56) References Cited

U.S. PATENT DOCUMENTS

2018/0061893 A1    3/2018  Breedlove et al.
2019/0245164 A1*   8/2019  Zou .................... H01L 27/3211
2020/0344897 A1*  10/2020  Kim .................... H05K 5/0004

OTHER PUBLICATIONS

Han et al.,"Glass and Plastics Platforms for Foldable Electronics and Displays." DOI: 10.1002/adma.201501060, 2015, 2015, vol. 27, pp. 4969-4974.

Lee et al., "Monolithic Flexible Vertical GaN Light-Emitting Diodes for a Transparent Wireless Brain Optical Stimulator." DOI: 10.1002/adma.201800649, 2018, vol. 30, 1800649, 10 pages.

* cited by examiner

FOLDABLE DISPLAYS AND METHODS

CROSS REFERENCE TO RELATED APPLICATION

The subject patent application claims priority to U.S. Provisional Patent Appln. No. 62/918,935, filed Feb. 21, 2019, entitled "Manufacturing Foldable Displays Using Flexible or Foldable LED Display Connectors." The entirety of the aforementioned application is hereby incorporated by reference herein.

TECHNICAL FIELD

The present disclosure generally relates to flexible or foldable displays and displays connectors and associated methods.

BACKGROUND

It is difficult to live any meaningful amount of time without interacting with some kind of electronic display. Displays are used in computers, televisions, mobile phones, watches, etc. and have become integral to life in modern society. Traditional displays are rigid (non-bendable) and are usually flat-surfaced. Some curved displays exist, though they are typically rigid as well.

More recently, foldable displays have come into fruition. Foldable displays offer increased versatility for associated devices. For instance, a foldable display can be folded inward for space-savings and display protection. Unfolding the screen can provide a larger size for a better user-experience.

However, existing foldable displays experience problems. Organic Light Emitting Diode (OLED) displays, which offer a great viewing experience, are sensitive to moisture and oxygen such that additional protection is often required to protect the OLED panel. Such additional protection can be difficult and expensive to implement for foldable OLED panels. Liquid Crystal Display (LCD) panels are inherently difficult and expensive to make foldable because of the liquid crystals. Traditional Light Emitting Diode (LED) displays, a subset of LCD displays utilizing LED backlighting, experience issues similar to regular LCD displays (absent LED backlighting).

MicroLED and miniLED technology has shown promise for foldable displays. MicroLED and miniLED displays don't require the same level of encapsulation as OLEDs and can allow for tighter bending radiuses. MicroLED and miniLED displays are highly energy efficient, long lasting, and are generally stable in humid environments. MicroLED and miniLED panels offer excellent optical performance in part due to not requiring separate backlighting. However, microLED and miniLED displays present high costs when used in an entire display.

The above-described background relating to foldable displays is merely intended to provide a contextual overview of some current issues and is not intended to be exhaustive. Other contextual information may become further apparent upon review of the following detailed description.

DESCRIPTION OF DRAWINGS

Various non-limiting embodiments of the subject disclosure are described with reference to the following figures, wherein like reference numerals refer to like parts throughout unless otherwise specified.

DETAILED DESCRIPTION

Figure 1:
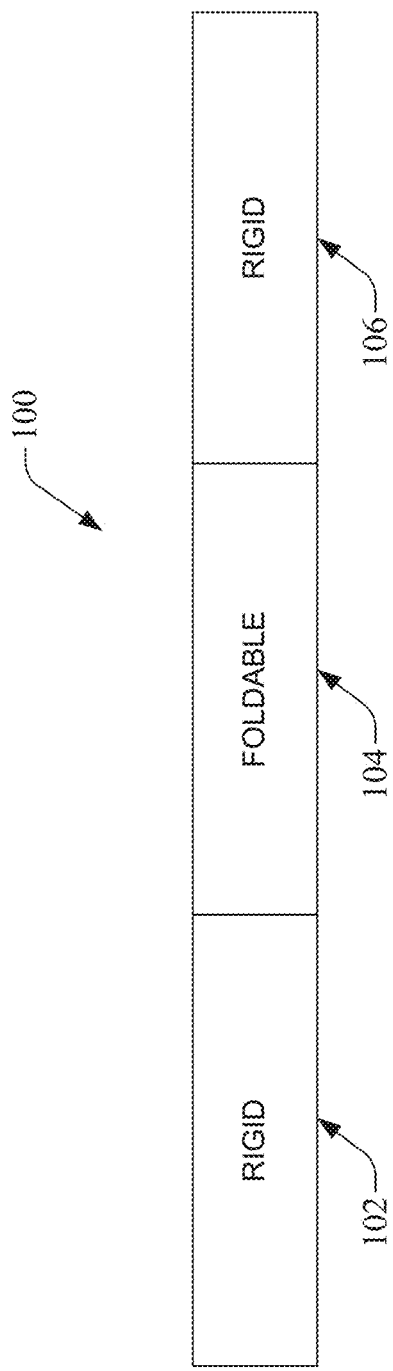
FIG. 1 is a display apparatus in accordance with one or more embodiments described herein.

Various specific details of the disclosed embodiments are provided in the description below. One skilled in the art will recognize, however, that the techniques described herein can in some cases be practiced without one or more of the specific details, or with other methods, components, materials, etc. In other instances, well-known structures, materials, or operations are not shown or described in detail to avoid obscuring certain aspects.

Embodiments described herein provide apparatuses and methods that enable high-quality display technology at reduced costs while providing exceptional durability. Various embodiments herein primarily utilize a single foldable display and two rigid displays. However, it can be appreciated that various combinations of rigid and foldable displays can be implemented. For instance, a singularity or plurality of foldable displays can be utilized in a display apparatus. Likewise, a singularity or plurality of flat/rigid displays can be utilized in a display apparatus.

Flexible connectors can be utilized in connections between display panels, between display panels and other components, or in any connection between any component of associated displays apparatuses. Such flexible connectors can be foldable and even stretchable. The flexible connectors can be utilized in Microelectromechanical Systems (MEMS). Such flexible connectors can maintain electrical connections while preventing damage or loss of connection when bent. Flexible connectors can comprise a wavy connector, which will be later described in greater detail, or other types of flexible connectors as would be understood by one skilled in the art.

Transparent film(s) or layer(s) can be received atop associated display apparatuses or other layers to provide scratch or impact protection or to modify a refractive index of an associated screen, for instance, to prevent glare. Such films and layers can be flexible.

Embodiments described herein enable the formation of indistinguishable seams between display panels. For instance, a display apparatus comprising two rigid panels with a flexible or foldable panel therebetween can possess indistinguishable seams, thereby creating the illusion of the display apparatus having a single panel, as opposed to a plurality of panels.

Flexible substrates can be provided as a base for a singularity or plurality of display panels. Flexible substrates can comprise Thin-Film Transistor (TFT) type substrates. Flexible connectors can additionally be provided between the flexible substrates and other components.

For instance, in one embodiment, a display apparatus is described herein. The display apparatus comprises a rigid display panel disposed on a substrate and a flexible display panel disposed on the substrate, wherein the flexible display panel is adjacent to the rigid display panel.

In another embodiment, a method is described herein. The method comprises disposing a flexible screen on a surface of a flexible substrate material, and disposing a rigid screen on the surface of the flexible substrate material, wherein the flexible screen and the rigid screen are in contact and form an indistinguishable seam.

In a further embodiment, a screen is described herein. The screen comprises a first rigid display at a first end of a surface of a flexible substrate, a second rigid display at a second end of the surface of the flexible substrate, and a flexible display on the surface of the flexible substrate, between the first rigid display and the second rigid display, wherein a first section of the flexible substrate underneath the flexible display is thicker than a second section of the flexible substrate underneath the first rigid display or the second rigid display, and the first rigid display and second rigid display, and flexible display are covered with a protective foldable layer.

The above aspects of the disclosure and/or other features of respective embodiments thereof are described in further detail with respect to the respective drawings below. It should be appreciated that additional manifestations, configurations, implementations, protocols, etc. can be utilized in connection with the following components described herein or different/additional components as would be appreciated by one skilled in the art.

With reference to FIG. 1, illustrated is an exemplary display apparatus 100 in accordance with various embodiments disclosed herein. The display apparatus 100 comprises rigid panels 102 and 106. Between the rigid panels 102 and 106 is a foldable (or flexible) panel 104.

According to an embodiment, the foldable panel 104 comprises a hinged portion of a display apparatus 100. According to an example, the hinged portion comprises a small portion of the display apparatus 100. The foldable panel 104 can be capable of bending more than 180 degrees so that an end of the rigid panel 102 and an end of the rigid panel 106 can come into contact with each other.

According to another embodiment, the hinged portion (in this case, comprising foldable panel 104) comprises a microLED or miniLED panel. The use of microLED or miniLED panels increases moisture and oxygen resistance, thereby reducing the need for foldable encapsulation layers, which are typically required for the prevention of oxygen or moisture intrusion into flexible OLED panels. The excellent contrast of microLED and miniLED displays enable them to be used in conjunction with rigid OLED displays (e.g., rigid panel 102 or rigid panel 106), or other display types such as LCD displays, without a noticeable difference in appearance, thereby contributing to an indistinguishable seam between display panels of different types. MicroLED or miniLED pixels can be placed directly on a substrate (e.g., TFT substrate) by pick-and-place from, for instance, from sapphire. Other embodiments can utilize a nano-LED panel 104, which exhibits excellent efficiency and speed.

Rigid panel 102 and rigid panel 106 can be flat or can alternatively be curved. Rigid panel 102 and 106 are generally rigid when compared to the foldable panel 104, but the rigid panels 102 and 106 can be semi-bendable or bendable. Rigid display panel 102 or rigid display panel 106 can comprise a variety of technology types. For instance, display panel 102 or display panel 106 can comprise OLED, LCD, LED, or even microLED, miniLED, or nano-LED. Other display technology types as would be recognized by one skilled in the art can alternatively be utilized.

By using sections of rigid panels where bending is not needed, total cost of a display apparatus 100 can be reduced. According to an example, rigid panels such as rigid panels 102 or 106 comprise a larger percentage of the total screen than the percentage represented by the foldable portion, such as the foldable panel 104. Other embodiments can comprise smaller rigid panels and larger foldable panels.

Figure 12:
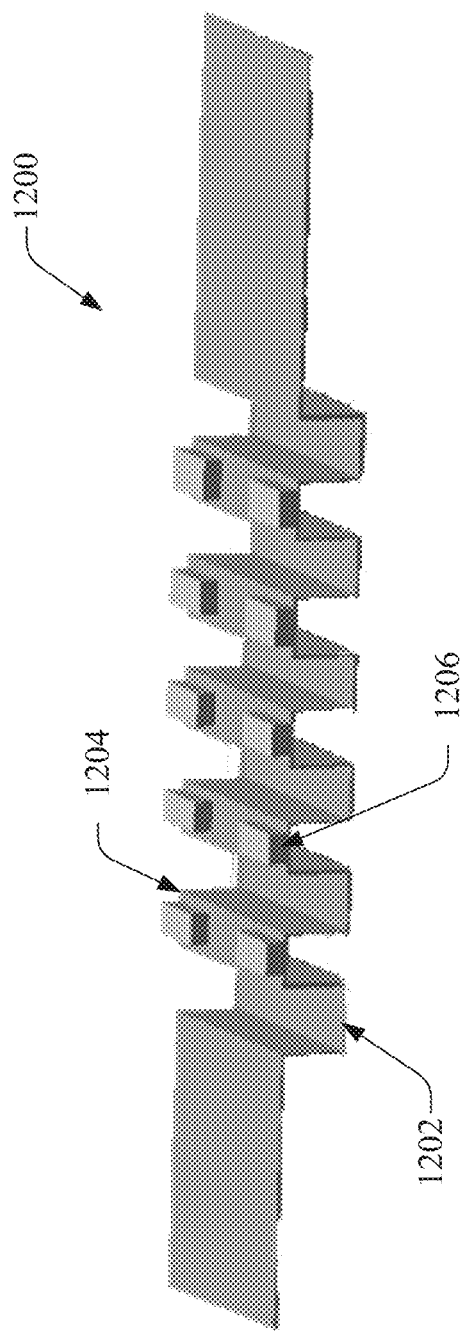
FIG. 12 is a wavy connector in accordance with one or more embodiments described herein.

Individual panels can be connected to other panels with wavy connectors, such as wavy connector 1200 as shown in FIG. 12. These wavy connectors, which will be later described in greater detail, can be thin so as to maintain the imperceptibility of a plurality of panels utilized in a display apparatus 100. In this regard, the display apparatus 100 can have the appearance of comprising a single display panel.

FIGS. 2-5 represent various exemplary panel configurations. Such configurations can be similar to display apparatus 100 but are not required to be. Therefore, it can be appreciated that additional configurations can be utilized such that embodiments herein are not limited to the configurations shown in FIGS. 2-5.

Figure 2:
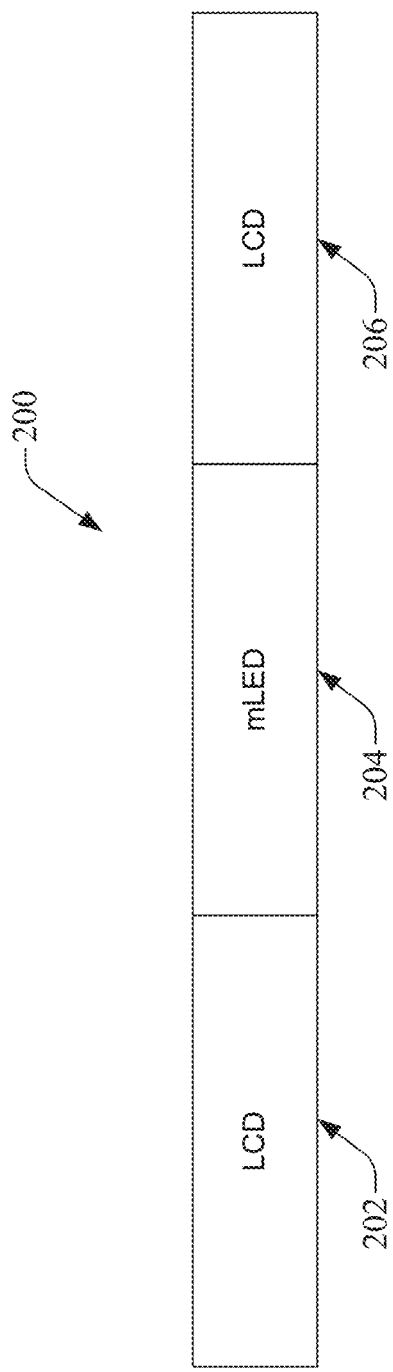
FIG. 2 is a display apparatus in accordance with one or more embodiments described herein.

With reference to FIG. 2, a display apparatus 200 is depicted. Panel 202 and panel 206 each comprise an LCD panel. According to an embodiment, panels 202 and 206 are rigid and are each connected to an mLED (microLED or miniLED) panel 204 (e.g., via a wavy connector). In this regard, the mLED panel is bendable and represents a hinged portion of the display apparatus 200. Other embodiments can utilize a nano-LED panel 202, 204, or 206.

Figure 3:
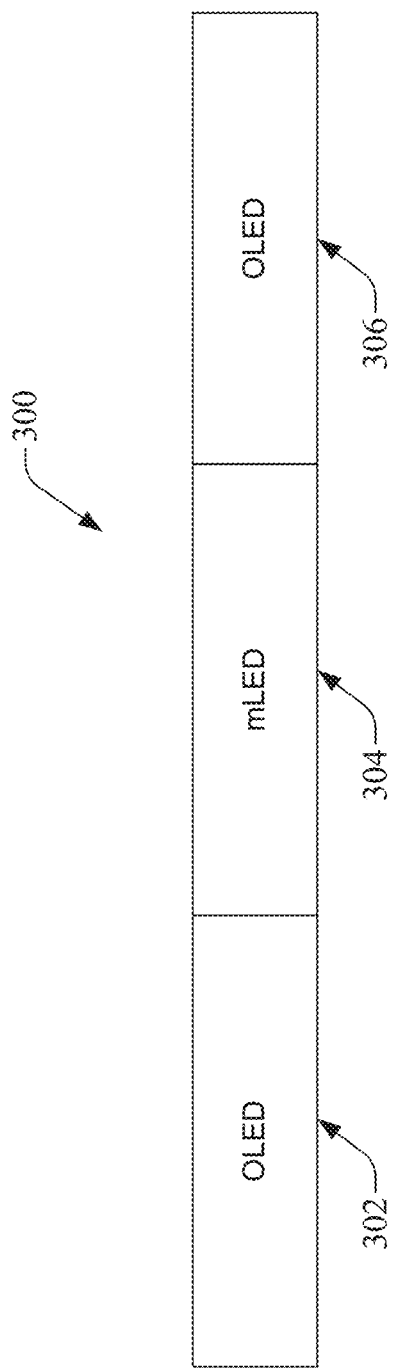
FIG. 3 is a display apparatus in accordance with one or more embodiments described herein

Turning now to FIG. 3, a display apparatus 300 is depicted. Panel 302 and panel 306 each comprise an OLED panel. According to an embodiment, panels 302 and 306 are rigid and are each connected to an mLED panel 304 (e.g., via a wavy connector). In this regard, the mLED panel represents a hinged portion of the display apparatus 300.

Figure 4:
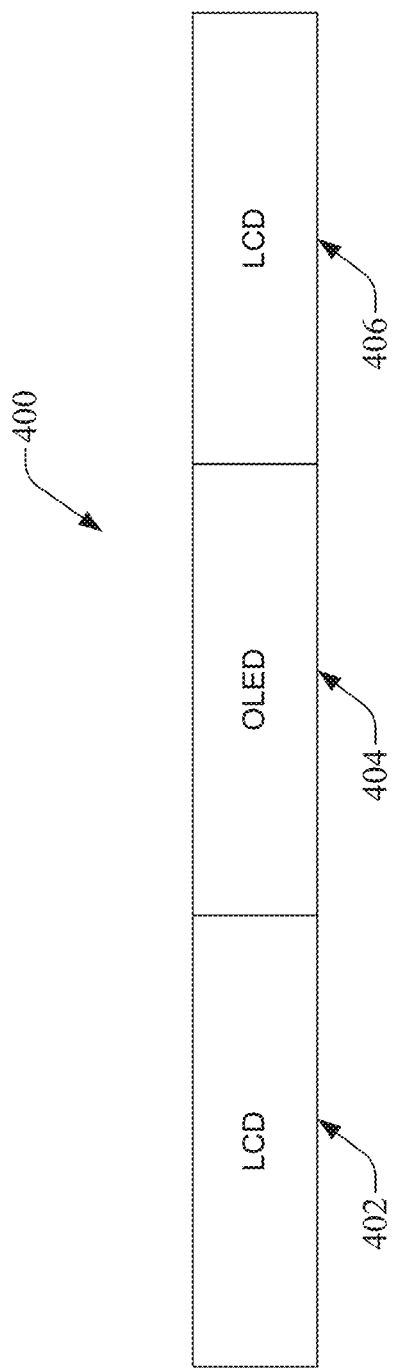
FIG. 4 is a display apparatus in accordance with one or more embodiments described herein.

FIG. 4 illustrates a display apparatus 400. Panel 402 and panel 406 each comprise an LCD panel. According to an embodiment, panel 402 and panel 406 are each connected to an OLED panel 404 (e.g., via a wavy connector). The OLED panel 404 is bendable and can represent a hinged portion of the display apparatus 400. The OLED panel 404 can comprise a foldable encapsulation material such that the OLED panel 404 is protected from moisture or oxygen intrusion throughout many bending cycles.

Figure 5:
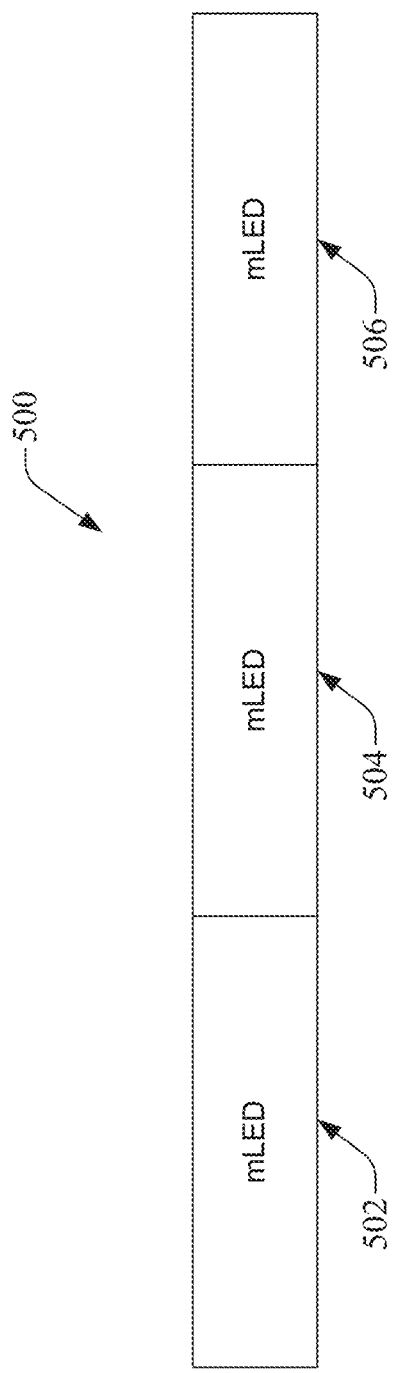
FIG. 5 is a display apparatus in accordance with one or more embodiments described herein.

Referring now to FIG. 5, a display apparatus 500 is depicted. The display apparatus comprises a plurality of mLED panels (e.g., mLED panel 502, mLED panel 504, and mLED panel 506). In this regard, any of mLED panel 502, mLED panel 504, and mLED panel 506 can be flexible (or flexible) or rigid. For instance, according to an embodiment, mLED panels 502 and 506 can be rigid, while mLED panel 504 is bendable.

FIGS. 6-10 illustrate represent various exemplary panel configurations. Therefore, it can be appreciated that additional configurations can be utilized such that embodiments herein are not limited to the configurations shown in FIGS. 6-10.

Figure 6:
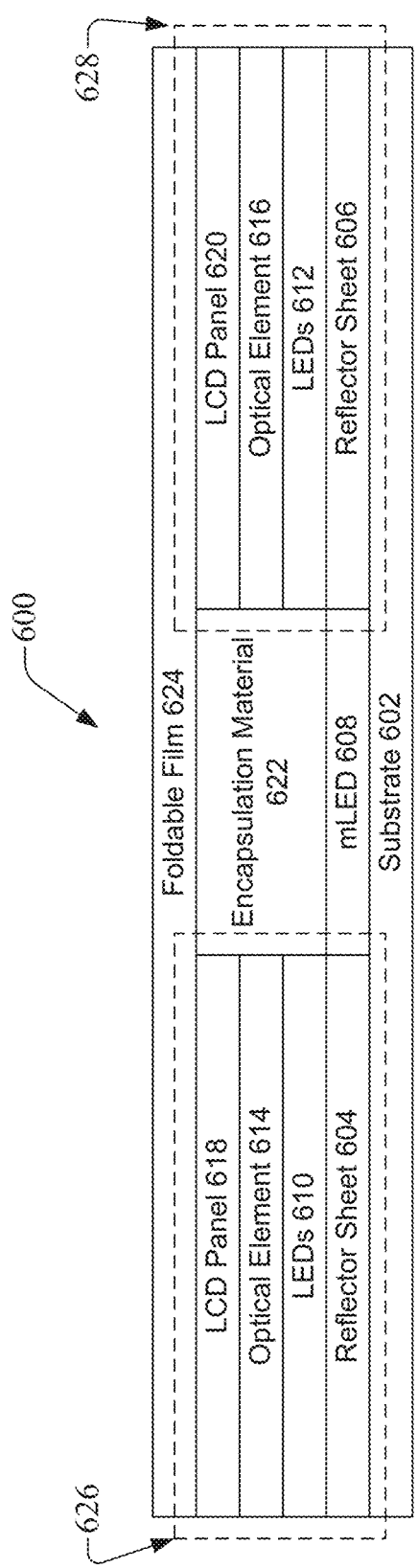
FIG. 6 is a display apparatus in accordance with one or more embodiments described herein.

With reference to FIG. 6, a display apparatus 600 is depicted. According to an embodiment, the display apparatus 600 can comprise a substrate 602, mLED 608, encapsulation material 622, LCD assembly 626, LCD assembly 628, and a foldable film 624. The LCD assembly 626 can comprise reflector sheet 604, LEDs 610, optical element 614, and LCD panel 618. The LCD assembly 628 can comprise reflector sheet 606, LEDs 612, optical element 616, and LCD panel 620.

Substrate 602 can comprise a silicone or rubber materials. Substrate 602 can comprise TFTs for any of the display panels or assemblies of the display apparatus 600 (e.g., LCD assembly 626, LCD assembly 628, or mLED 608). The substrate 602 can be flexible or elastic. The substrate 602 can facilitate electrical connection to/from other various components of the display apparatus 600 and other components to which the display apparatus 600 interacts with (e.g., CPU, GPU, etc.).

The substrate 602 can utilize wavy connectors (e.g., wavy connector 1200) between the substrate 602 and any of the LCD assembly 626, LCD assembly 628, or mLED 608. Further, wavy connectors can be implemented between the LCD assembly 626 and the mLED 608. Likewise, wavy connectors can be implemented between the LCD assembly 628 and mLED 608. It can be appreciated that wavy connectors can be utilized between any layer of component or subcomponent of the display apparatus 600 where flexibility, bendability, durability, etc. are desired.

LCD assembly 626, LCD assembly 628, and mLED 608 can each be disposed on a surface of the substrate 602. According to an embodiment, the mLED 608 can be adjacent to either of the LCD assembly 626 or LCD assembly 628 (or can be adjacent to both as shown in FIG. 6). In this regard, the LCD assembly 626 and LCD assembly 628 can be adjacent to opposite edges of the mLED 608. The encapsulation material 622 can be disposed on the mLED 608 and between the LCD assembly 626 and LCD assembly 628. The encapsulation material 622 can comprise polymer materials. The foldable film 624 can be received atop the LCD assembly 626, LCD assembly 628, and encapsulation material 622. The foldable film 624 can comprise glass or polymer materials.

Figure 7:
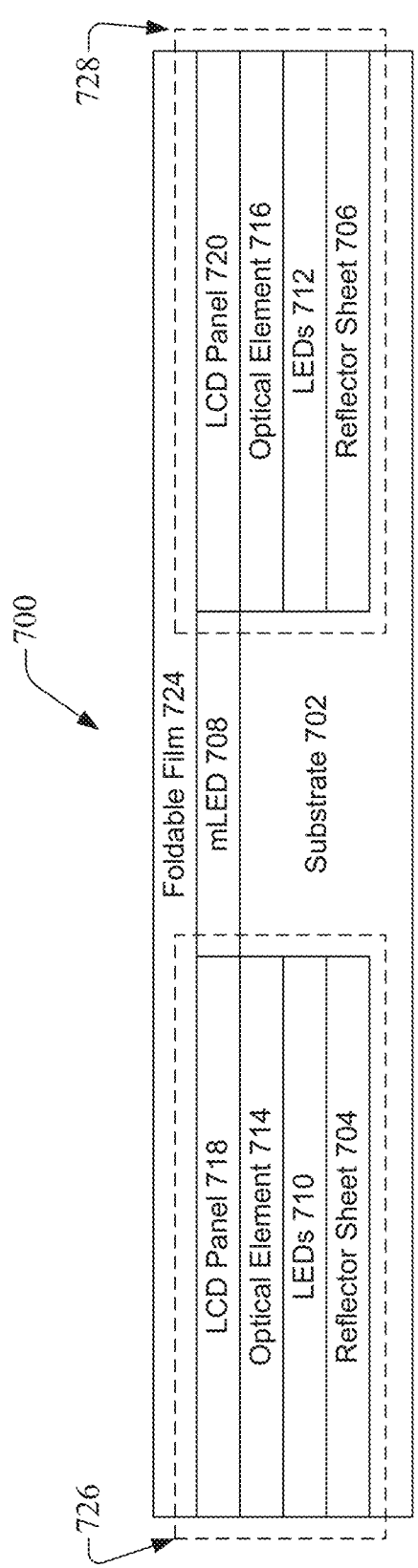
FIG. 7 is a display apparatus in accordance with one or more embodiments described herein.

Turning now to FIG. 7, a display apparatus 700 is depicted. According to an embodiment, the display apparatus 700 can comprise a substrate 702, mLED 708, LCD assembly 726, LCD assembly 728, and a foldable film 724. The LCD assembly 726 can comprise reflector sheet 704, LEDs 710, optical element 714, and LCD panel 718. The LCD assembly 728 can comprise reflector sheet 706, LEDs 712, optical element 716, and LCD panel 720.

mLED 708 can comprise properties similar to those of mLED 608. Likewise, LCD assembly 726 can comprise properties similar to those of LCD assembly 626, and LCD assembly 728 can comprise properties similar to those of LCD assembly 628. Similarly, substrate 702 can comprise properties similar to those of substrate 602 and foldable film 724 can comprise properties similar to those of foldable film 624.

According to an embodiment, the mLED 708 is disposed on an increased-thickness-portion of the substrate 702. In this regard, a top surface of mLED 708 can be substantially coplanar with a top surface of the LCD assembly 726 or a top surface of the LCD assembly 728.

Figure 8:
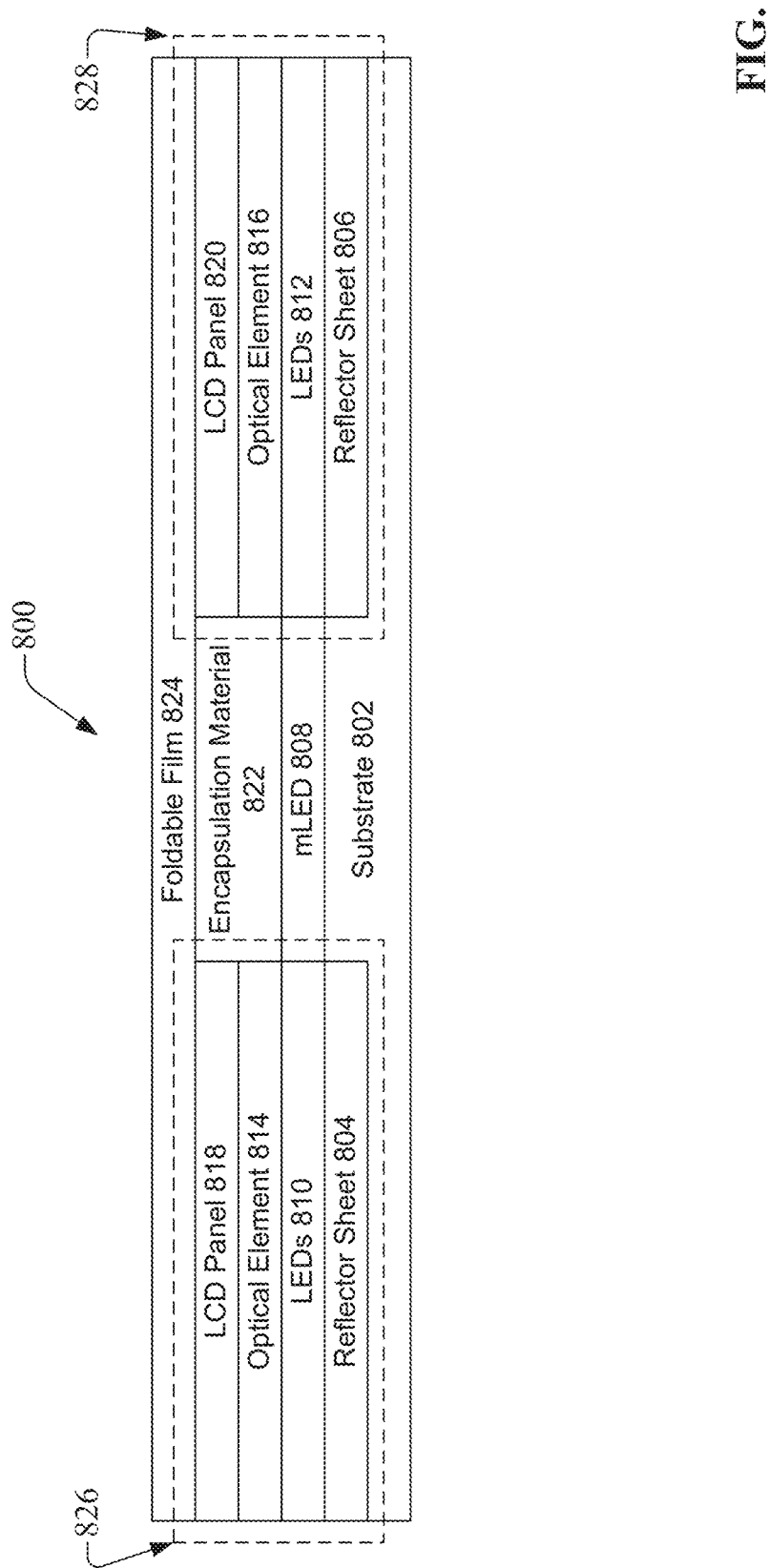
FIG. 8 is a display apparatus in accordance with one or more embodiments described herein.

Referring now to FIG. 8, a display apparatus 800 is depicted. According to an embodiment, the display apparatus 800 can comprise a substrate 802, mLED 808, encapsulation material 822, LCD assembly 826, LCD assembly 828, and a foldable film 824. The LCD assembly 826 can comprise reflector sheet 804, LEDs 810, optical element 814, and LCD panel 818. The LCD assembly 828 can comprise reflector sheet 806, LEDs 812, optical element 816, and LCD panel 820.

mLED 808 can comprise properties similar to those of mLED 608. Likewise, LCD assembly 826 can comprise properties similar to those of LCD assembly 626, and LCD assembly 828 can comprise properties similar to those of LCD assembly 628. Similarly, substrate 802 can comprise properties similar to those of substrate 602 and foldable film 824 can comprise properties similar to those of foldable film 624. Further, encapsulation material 822 can comprise properties similar to those of encapsulation material 622.

The substrate 802 can comprise additional thickness underneath mLED 808. This can enable the mLED 808 to be substantially coplanar with the LEDs 810 or LEDs 812 (e.g., the mLED 808 to be substantially coplanar with the backlight of the LCD assembly 826 or the backlight of the LCD assembly 828). The encapsulation material 822 can be disposed on the mLED 808 and between the LCD assembly 826 and LCD assembly 828. The foldable film 824 can be received atop the LCD assembly 826, LCD assembly 828, and encapsulation material 822.

Figure 9:
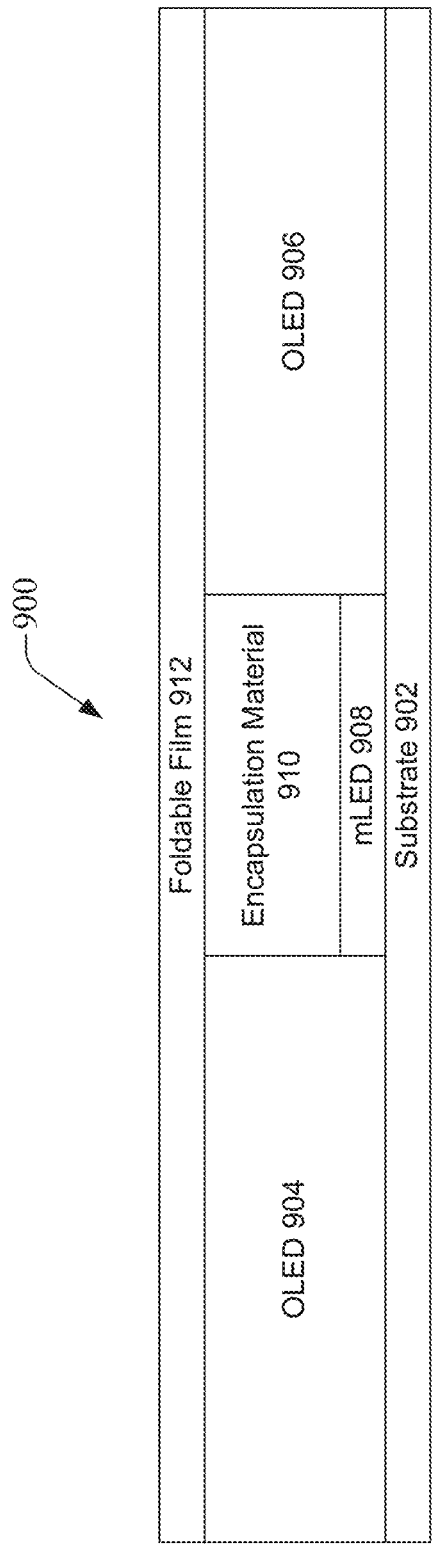
FIG. 9 is a display apparatus in accordance with one or more embodiments described herein.

With reference to FIG. 9, a display apparatus 900 is shown. The display apparatus 900 can comprise a substrate 902, OLED 904, OLED 906, mLED 908, encapsulation material 910, and foldable film 912. OLED 904, OLED 906, and mLED 908 can each be disposed on a surface of the substrate 902. The encapsulation material 910 can be disposed on the mLED 608 and between the OLED 904 and OLED 908. The foldable film 912 can be received atop the OLED 904, OLED 906, and encapsulation material 910.

mLED 908 can comprise properties similar to those of mLED 608. Similarly, substrate 902 can comprise properties similar to those of substrate 602 and foldable film 912 can comprise properties similar to those of foldable film 624. Further, encapsulation material 910 can comprise properties similar to those of encapsulation material 622.

The OLED 904 or OLED 906 can be frit sealed, for instance, by counter glass.

The substrate 902 can utilize wavy connectors between the substrate 902 and any of the OLED 904, OLED 906, or mLED 908. Further, wavy connectors can be implemented between the OLED 904 and the mLED 908. Likewise, wavy connectors can be implemented between the OLED 906 and mLED 908. It can be appreciated that wavy connectors can be utilized between any layer of component or subcomponent of the display apparatus 900 where flexibility, bendability, durability, etc. are desired.

Figure 10:
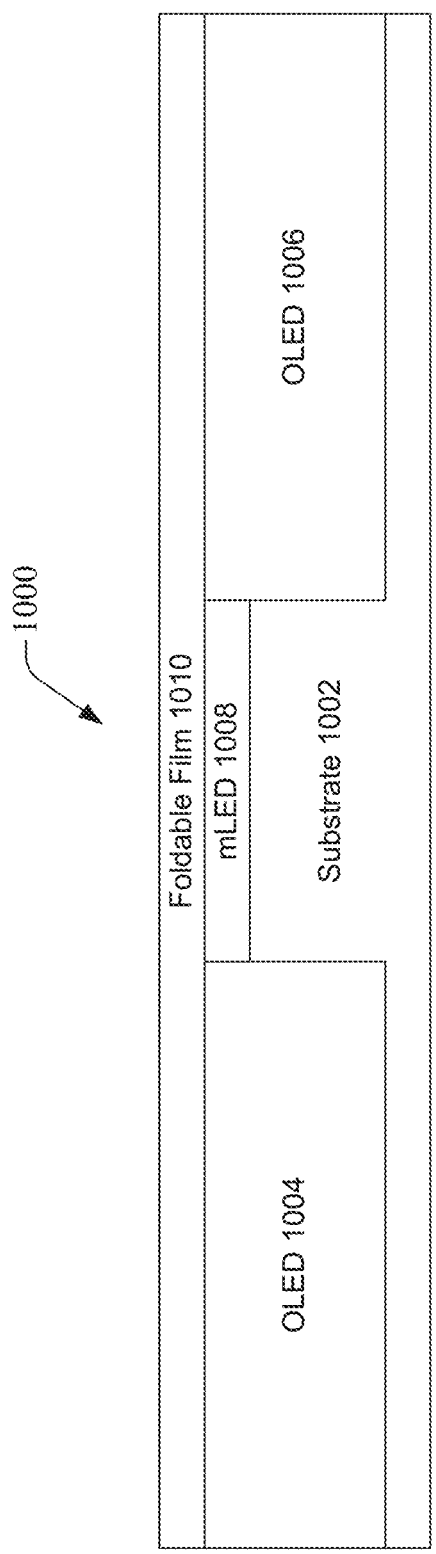
FIG. 10 is a display apparatus in accordance with one or more embodiments described herein.

FIG. 10 illustrates a display apparatus 1000. The display apparatus 1000 comprises a substrate 1002, OLED 1004, OLED 1006, mLED 1008, and foldable film 1010.

mLED 1008 can comprise properties similar to those of mLED 608. Similarly, substrate 1002 can comprise properties similar to those of substrate 602 and foldable film 1010 can comprise properties similar to those of foldable film 624. Further, OLED 1004 can comprise properties similar to those of OLED 904, and OLED 1006 can comprise properties similar to those of OLED 906.

The substrate 1002 can comprise additional thickness underneath mLED 1008. This can enable a top surface of the mLED 1008 to be substantially coplanar with a top surface of the OLED 1004 or a top surface of the OLED 1006. The foldable film 1010 can be received atop the OLED 1004, OLED 1006, and mLED 1008.

Figure 11:
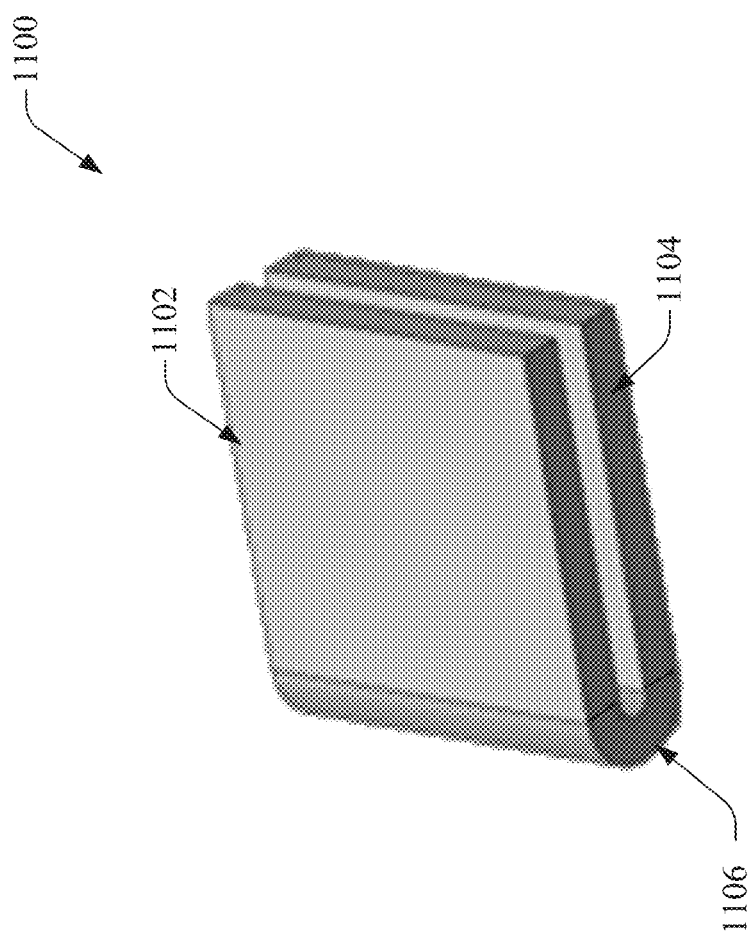
FIG. 11 is a display apparatus in accordance with one or more embodiments described herein.

FIG. 11 depicts an exemplary display apparatus 1100 which incorporates three separate displays in accordance with various embodiments described herein. Other embodiments may utilize different combinations of displays. Display apparatus 1100 comprises a rigid display 1102, rigid display 1104, and bendable display 1106. It can be appreciated that the display apparatus is depicted in a closed position, with the viewing surfaces of the rigid displays 1102 and 1104 and bendable display 1106 largely concealed and protected. The display apparatus 1100 can be opened, like a book, to reveal the viewing surfaces of the rigid displays 1102 and 1104 and bendable display 1106. Other embodiments can comprise viewable panels on an exterior of the display apparatus 1100 when the display apparatus 1100 is in a closed position. Though the rigid displays 1102 and 1104 are depicted as approximately parallel, the bendable display 1106 can bend greater than 180 degrees, thus enabling an edge of the rigid display 1102 to contact an edge of the rigid display 1104. Rigid display 1102 can comprise an LED display, LCD display, OLED display, or other technology type. Likewise, rigid display 1104 can comprise an LED display, LCD display, OLED display, or other technology type. Bendable display 1106 can comprise a miniLED, microLED, OLED, or other bendable display technology type.

Display apparatus 1100, as well as other apparatuses described herein, can be utilized, for instance in a foldable mobile phone screen or in other bendable devices.

Other embodiments similar to FIGS. 6-11 can utilize nano-LED panels.

Turning now to FIG. 12, a wavy connector 1200 is depicted. The wavy connector 1200 can be MEMS-compatible. The wavy connector 1200 can comprise one or more foldable circuits. The wavy connector 1200 can comprise a plurality of valleys 1202 and peaks 1204. Each valley 1202 or peak 1204 can comprise a plurality of contacts 1206 on a top side or bottom side of said valley 1202 or peak 1204. The contacts 1206 can facilitate connections to a plurality of components. For instance, the contacts 1206 can facilitate electrical connections to a substrate, LCD display, OLED display, mLED display, nano-LED display, or to layers or subcomponents of the foregoing in addition to other connectable components. There exists space between each peak 1204. Likewise, there exists space between each valley 1202. This space allows the wavy connector to bend with minimal stress. In this regard, stress can be reduced in a creasing region of a display utilizing a wavy connector. The wavy connector 1200 can also be stretchable. The wavy connector 1200 can be extremely thin, such that disposition between two displays does not cause a seam between said displays to be perceivable to a human eye.

Wavy connector 1200 can comprise one or more of a plurality of materials, such as silicones, rubbers, conductive materials, etc.

Figure 13:
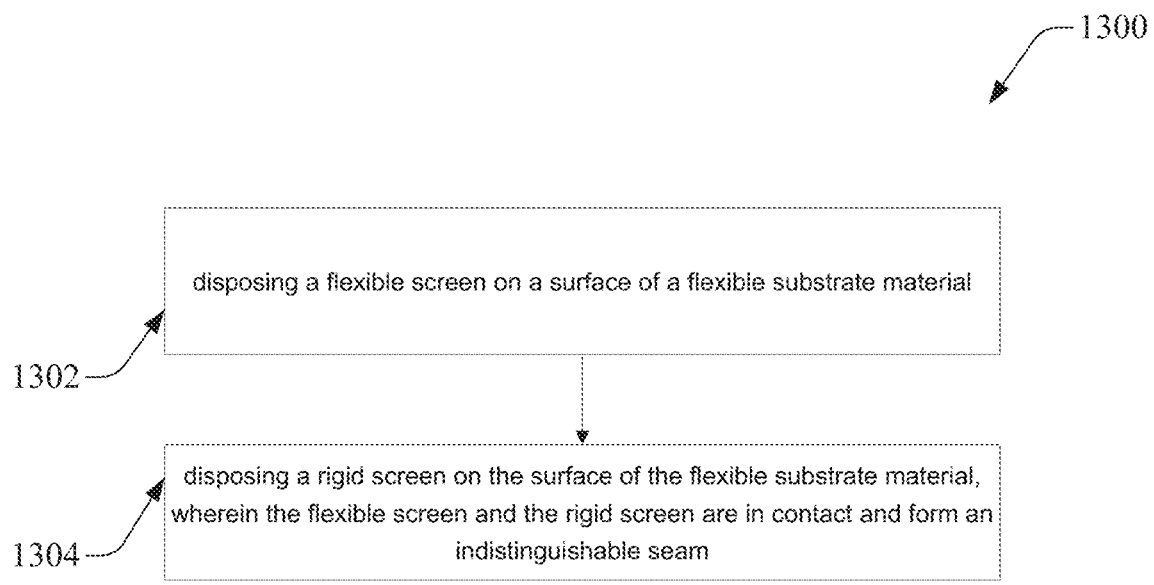
FIG. 13 is a block flow diagram for a method for making a viewing apparatus in accordance with one or more embodiments described herein.

FIG. 13 illustrates a flow diagram of a process 1300 for making a viewing apparatus in accordance with one or more embodiments described herein. At 1302, a flexible screen is disposed on a surface of a flexible substrate material. At 1304, a rigid screen is disposed on the surface of the flexible substrate material, wherein the flexible screen and the rigid screen are in contact and form an indistinguishable seam.

FIG. 13 illustrates respective methods or systems in accordance with certain aspects of this disclosure. While, for purposes of simplicity of explanation, the methods or systems are shown and described as a series of acts, it is to be understood and appreciated that this disclosure is not limited by the order of acts, as some acts may occur in different orders and/or concurrently with other acts from those shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure.

The above description includes non-limiting examples of the various embodiments. It is, of course, not possible to describe every conceivable combination of components or methods for purposes of describing the disclosed subject matter, and one skilled in the art may recognize that further combinations and permutations of the various embodiments are possible. The disclosed subject matter is intended to embrace all such alterations, modifications, and variations that fall within the spirit and scope of the appended claims.

With regard to the various functions performed by the above described components, devices, circuits, systems, etc., the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature may be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A display apparatus, comprising:
   a first rigid display panel disposed on a substrate at a first edge of a surface the substrate, wherein the first rigid display panel is connected to the substrate with a wavy connector;
   a flexible or foldable display panel disposed on the substrate at a center portion of the surface of the substrate, next to the first edge, wherein the flexible or foldable display panel is adjacent to the first rigid display panel;
   a second rigid display panel disposed on the substrate adjacent to a second edge of the flexible or foldable display panel, wherein the second edge is opposite the first edge;
   an encapsulation material that fills an area above the flexible or foldable display panel, the area being between the first rigid display panel and the second rigid display panel; and
   a transparent foldable film applied overtop the first rigid display panel, the second rigid display panel, and the encapsulation material.

2. The display apparatus of claim 1, wherein the flexible or foldable display panel comprises a wavy structured flexible or foldable display panel, wherein the first rigid display panel is connected to the wavy structured flexible or foldable display panel, and wherein the second rigid display panel is connected to the wavy structured flexible or foldable display panel.

3. The display apparatus of claim 1, wherein the first rigid display panel comprises a liquid-crystal display panel, an organic light-emitting diode panel, mini-light-emitting diode panel, a micro-light-emitting diode panel, or a nano light-emitting diode panel.

4. The display apparatus of claim 1, wherein the flexible or foldable display panel comprises a mini-light-emitting diode panel, a micro-light-emitting diode panel, or an organic light-emitting diode panel.

5. The display apparatus of claim 1, wherein the flexible or foldable display panel is coplanar with a backlight of the first rigid display panel.

6. The display apparatus of claim 5, wherein the flexible or foldable display panel comprises a light-emitting diode screen, and wherein the first rigid display panel and the second rigid display panel each comprise a liquid-crystal-display screen.

7. A method for making a viewing apparatus, comprising:
   disposing a foldable screen on a surface of a foldable substrate material at a center portion of the surface of the foldable substrate material;
   disposing a first rigid screen on the surface of the foldable substrate material at a first side of the surface of the foldable substrate material, next to the center portion, wherein
   the foldable screen and the first rigid screen are in contact and form a first indistinguishable seam, and
   the first rigid screen is connected to the foldable substrate material with a wavy connector;
   disposing a second rigid screen on the surface of the foldable substrate material at a second side of the surface of the foldable substrate material, opposite the first side and next to the center portion, wherein the foldable screen and the second rigid screen are in contact and form a second indistinguishable seam; and
   filling an area above the foldable screen and between the first rigid screen and the second rigid screen with an encapsulation material, wherein the encapsulation material is filled to a height of the first rigid screen and the second rigid screen.

8. The method of claim 7, wherein the first rigid screen and the second rigid screen each comprise an organic light-emitting diode screen.

9. The method of claim 7, wherein the foldable screen comprises a micro-light-emitting diode screen or a mini-light-emitting diode screen.

10. The method of claim 7, further comprising:
    applying a foldable film overtop the first rigid screen, second rigid screen, and encapsulation material.

11. The method of claim 7, wherein the first rigid screen and the second rigid screen each comprise a liquid-crystal display screen.

12. The method of claim 11, wherein the foldable screen is coplanar with a backlight of the first rigid screen, and wherein the foldable screen comprises a light-emitting diode screen.

13. The method of claim 7, wherein the foldable screen comprises a wavy structured foldable screen, and wherein the method further comprises:
    connecting the first rigid screen to the wavy structured foldable screen; and
    connecting the second rigid screen to the wavy structured foldable screen.

14. The method of claim 7, further comprising:
    connecting the second rigid screen to the foldable substrate material with a wavy connector, wherein the first rigid screen comprises a micro-light-emitting diode chip connected to the foldable substrate material with a wavy connector.

15. The method of claim 7, wherein the first rigid screen comprises a nano light-emitting diode panel.

16. The method of claim 7, wherein the foldable screen comprises an organic light-emitting diode panel.

17. A screen, comprising:
    a first rigid display at a first end of a surface of a flexible substrate, wherein the first rigid display is connected to the flexible substrate with a first wavy connector;
    a second rigid display at a second end of the surface of the flexible substrate, wherein the second rigid display is connected to the flexible substrate with a second wavy connector; and
    a flexible display on the surface of the flexible substrate, between the first rigid display and the second rigid display, wherein
    a first section of the flexible substrate underneath the flexible display is thicker than a second section of the flexible substrate underneath the first rigid display or the second rigid display, and
    the first rigid display and second rigid display, and flexible display are covered with a protective foldable layer.

18. The screen of claim 17, wherein the protective foldable layer modifies a refractive index of the screen.

19. The screen of claim 17, wherein the flexible substrate is a thin film transistor substrate for the first rigid display, the second rigid display, and the flexible display, wherein the flexible display comprises a stretchable display, wherein the first rigid display and the second rigid display comprise liquid-crystal-displays, and wherein the stretchable display comprises a light-emitting-diode display.

20. The screen of claim 17, wherein the first rigid display and the second rigid display each comprise an organic light-emitting diode display.

* * * * *